(12) United States Patent
Ieong et al.

(10) Patent No.: US 7,833,854 B2
(45) Date of Patent: *Nov. 16, 2010

(54) STRUCTURE AND METHOD OF FABRICATING A HYBRID SUBSTRATE FOR HIGH-PERFORMANCE HYBRID-ORIENTATION SILICON-ON-INSULATOR CMOS DEVICES

(75) Inventors: Meikei Ieong, Wappingers Falls, NY (US); Min Yang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 174 days.

This patent is subject to a terminal disclaimer.

(21) Appl. No.: 12/145,024

(22) Filed: Jun. 24, 2008

(65) Prior Publication Data

US 2008/0261354 A1 Oct. 23, 2008

Related U.S. Application Data

(60) Continuation of application No. 11/830,489, filed on Jul. 30, 2007, now Pat. No. 7,425,483, which is a division of application No. 11/066,659, filed on Feb. 25, 2005, now Pat. No. 7,268,377.

(51) Int. Cl.
*H01L 21/336* (2006.01)
*H01L 21/8234* (2006.01)

(52) U.S. Cl. ............................... 438/198; 257/E21.036; 438/973

(58) Field of Classification Search .......... 257/E21.036; 438/198, 973
See application file for complete search history.

(56) References Cited

U.S. PATENT DOCUMENTS

| | | | |
|---|---|---|---|
| 4,442,448 A | 4/1984 | Shimbo | |
| 5,384,473 A | 1/1995 | Yoshikawa et al. | |
| 6,870,226 B2 | 3/2005 | Maeda et al. | |
| 6,902,962 B2 | 6/2005 | Yeo et al. | |
| 6,972,478 B1 | 12/2005 | Waite et al. | |
| 7,208,815 B2 | 4/2007 | Chen et al. | |
| 7,268,377 B2 * | 9/2007 | Ieong et al. | 257/255 |
| 7,425,483 B2 * | 9/2008 | Ieong et al. | 438/198 |

* cited by examiner

*Primary Examiner*—Asok K Sarkar
(74) *Attorney, Agent, or Firm*—Scully, Scott, Murphy & Presser, P.C.; Louis J. Percello, Esq.

(57) ABSTRACT

The present invention provides a method of integrating semiconductor devices such that different types of devices are formed upon a specific crystal orientation of a hybrid substrate that enhances the performance of each type of device. Specifically, the present invention provides a method of integrating semiconductor devices such that pFETs are located on a (110) crystallographic plane, while nFETs are located on a (100) crystallographic plane of a planar hybrid substrate. The method of the present invention also improves the performance of creating SOI-like devices with a combination of a buried insulator and counter-doping layers. The present invention also relates to semiconductor structures that are formed utilizing the method of the present invention.

13 Claims, 5 Drawing Sheets

STRUCTURE AND METHOD OF FABRICATING A HYBRID SUBSTRATE FOR HIGH-PERFORMANCE HYBRID-ORIENTATION SILICON-ON-INSULATOR CMOS DEVICES

RELATED APPLICATIONS

This application is a continuation of U.S. application Ser. No. 11/830,489, filed on Jul. 30, 2007, which is a divisional application of U.S. application Ser. No. 11/066,659, filed Feb. 25, 2005, now U.S. Pat. No. 7,268,377, issued on Sep. 11, 2007.

FIELD OF THE INVENTION

The present invention relates to high-performance metal oxide semiconductor field effect transistors (MOSFETs) for digital or analog applications, and more particularly to MOSFETs utilizing carrier mobility enhancement from surface orientation and parasitic and leakage reduction from semiconductor-on-insulator (SOI) structures.

BACKGROUND OF THE INVENTION

In present semiconductor technology, complementary metal oxide semiconductor (CMOS) devices, such as nFETs or pFETs, are typically fabricated upon semiconductor wafers, such as Si, that have a single crystal orientation. In particular, most of today's semiconductor devices are built upon Si having a (100) crystal orientation.

On one hand, electrons are known to have a high surface mobility for a (100) Si surface orientation, but holes are known to have high mobility for a (110) surface orientation. That is, hole mobility values on (100) Si are roughly 2×-4× lower than the corresponding electron mobility for this crystallographic orientation. To compensate for this discrepancy, pFETs are typically designed with larger widths in order to balance pull-up currents against the nFET pull-down currents and achieve uniform circuit switching. pFETs having larger widths are undesirable since they take up a significant amount of chip area.

On the other hand, hole mobilities on (110) Si are 2.5× higher than on a (100) Si surface; therefore, pFETs formed on a (110) surface will exhibit significantly higher drive currents than the pFETs formed on a (100) surface. Unfortunately, electron mobilities on (110) Si surfaces are significantly degraded compared to (100) Si surfaces.

As can be deduced from the above discussion, the (110) Si surface is optimal for pFET devices because of excellent hole mobility, yet such a crystal orientation is completely inappropriate for nFET devices. Instead, the (100) Si surface is optimal for nFET devices since that crystal orientation favors electron mobility.

Co-pending and co-assigned U.S. patent application Ser. No. 10/250,241, filed Jun. 17, 2003, provides an approach to fabricate CMOS devices on hybrid orientations wherein the pFETs are formed on a (110) surface orientation and nFETs are formed on a (100) surface orientation. Because hole mobility is greater than 150% on a (110) orientation than on a (100) orientation, the drive current of the pFET devices is greatly enhanced from conventional CMOS technology.

However, the prior art approach described in the '241 application places one type of device on a semiconductor-on-insulator (SOI) and the other type of device on a bulk material (i.e., an epitaxial layer) depending on the surface orientation of the SOI and the handle wafer. For example, with a (100) SOI and a (110) bulk handle wafer, nFETs will be SOI devices and pFETs will be bulk-like devices. With a (110) SOI and a (100) handle wafer, nFETs will be bulk-like devices and pFETs will be SOI devices.

As is known to those skilled in the art, devices formed on SOI substrates offer many advantages over their bulk counterparts including, for example, higher performance due to a reduction in parasitic capacitance and leakage, absence of latch-up, higher packing density and low voltage applications.

In view of the above, there is a need for providing a semiconductor structure that has different types of devices located on a specific optimal crystal orientation wherein each of the different types of devices is a SOI-like device.

SUMMARY OF THE INVENTION

The present invention provides a method of integrating semiconductor devices such that different types of devices are formed upon a specific crystal orientation of a hybrid substrate that enhances the performance of each type of device. Specifically, the present invention provides a method of integrating semiconductor devices (i.e., pFETs and nFETs) such that the pFETs are located on a (110) crystallographic plane, while the nFETs are located on a (100) crystallographic plane of a planar hybrid substrate. The method of the present invention also improves the performance of creating SOI-like devices with a combination of a buried insulator and counter-doping layers. The term "SOI-like" is used in the present invention to denote that the body of the device, i.e., the SOI layer, is isolated from an underlying substrate layer by a discontinuous buried insulating layer that includes counter-doped regions.

The present invention also provides a method of integrating different CMOS devices onto a hybrid substrate having different crystallographic surface planes wherein isolation regions are formed between the CMOS devices.

In accordance with the present invention, a semiconductor structure (including a hybrid substrate) and fabrication method that can combine the advantage of SOI and hybrid orientation are provided. In the present invention, a new mask level is used to define epitaxial windows which are smaller than the active area of one of the semiconductor regions. Counter-doping is also used in the present invention to provide a discontinuous buried insulating layer containing at least one counter-doped region that isolates the body of the device from the substrate to create a pseudo-SOI (or SOI-like) structure. The presence of the counter-doped region can also reduce the source/drain to substrate junction capacitance, if the epitaxial windows are located in the source/drain area.

Specifically, and in broad terms, the present invention provides a semiconductor structure, e.g., a hybrid crystal orientation substrate, that includes:

a first semiconductor region comprising a first semiconductor material having a first crystallographic orientation;

a second semiconductor region comprising a second semiconductor material having a second crystallographic orientation, wherein said first crystallographic orientation is different from said second crystallographic orientation and said first semiconductor material and said second semiconductor material have upper surfaces that are substantially coplanar to each other;

a continuous buried insulating layer present beneath one of said semiconductor materials; and a discontinuous buried insulating layer present beneath said other semiconductor material, wherein at least one counter-doped region is present that provides the discontinuity in the buried insulating layer creating a pseudo-SOI region.

In the present invention, the counter-doped region includes an upper doped region of a first conductivity type (P or N, preferably P), a middle doped region of a second conductivity type that is different from the first conductivity type (N or P, preferably N), and a lower doped region of said first conductivity type (P or N, preferably P). The lower doped region of the counter-doped region lies on an upper surface of an underlying semiconductor material. The upper doped region of the counter-doped region is in direct contact with an overlying semiconductor material.

In some embodiments of the present invention, an isolation region is present between the first and second semiconductor regions. In yet another embodiment of the present invention, the hybrid substrate further includes (in addition to the first and second semiconductor regions described above) a third semiconductor region comprising a third semiconductor material of a third crystallographic orientation and a fourth semiconductor region comprising a fourth semiconductor material having a fourth crystallographic orientation, wherein the third crystallographic orientation is different from the fourth crystallographic orientation, but equal to the first crystallographic orientation and said fourth crystallographic orientation is equal to the second crystallographic orientation. In this embodiment, the various semiconductor materials each have upper surfaces that are planar to one another and one of the third or fourth regions includes a continuous buried insulating layer (SOI) and said other of said third or fourth regions is present on a semiconductor substrate having said second crystal orientation (bulk).

In yet other embodiments of the present invention, the at least one counter-doped region has a doping profile that is engineered for better short-channel-effect (SCE) control without additional capacitance, leakage and mobility degradation. For example, the counter-doped region may comprise an upper P-doped region, a middle N-doped region and a lower P-doped region in which the upper P-doped region has a higher dopant concentration near the semiconductor material that will include the device channel relative to the lower doped region of the same conductivity type.

The present invention also provides a semiconductor structure in which at least one CMOS device, e.g. FET, is located in each of the various semiconductor regions of the hybrid substrate described above. The CMOS devices are located on a semiconductor material (for example, first or second) having a crystallographic orientation that provides that device with optimal performance. For example, a pFET will be present atop a semiconductor material having a (110) crystallographic orientation, while an nFET will present atop a semiconductor material having a (100) crystallographic orientation.

The present invention also provides a method of fabricating the inventive hybrid substrate as well as a method of integrating CMOS devices in each of the various regions of the hybrid substrate. Specifically, the hybrid substrate of the present invention is formed by:

providing a substrate comprising an upper semiconductor material of a first crystallographic orientation and a lower semiconductor material of a second crystallographic orientation separated by a buried insulating layer, said first crystallographic orientation is different from said second crystallographic orientation;

protecting a portion of said substrate to define a first semiconductor region, while leaving another portion of the substrate unprotected and defining a second semiconductor region; and first etching said unprotected portion of the substrate to expose a surface of the buried insulating layer utilizing a first mask that defines the active area within the second semiconductor region;

second etching said exposed surface of said buried insulating layer to expose said lower semiconductor material utilizing a second mask that has at least one opening that provides a window that is smaller in size than the active area; and growing a semiconductor material within said second semiconductor region on said exposed lower semiconductor material, said regrown semiconductor material having said second crystallographic orientation, wherein during initial stages of said growing process a counter-doped region is formed within said at least one opening.

In some embodiments of the present invention, isolation regions are formed after the growing process to isolate the first semiconductor region from said second semiconductor region. In yet another embodiment of the present invention, at least one first semiconductor device is formed in said first device region and at least one second semiconductor device is formed in said second semiconductor region.

DETAILED DESCRIPTION OF THE INVENTION

Figure 1A:
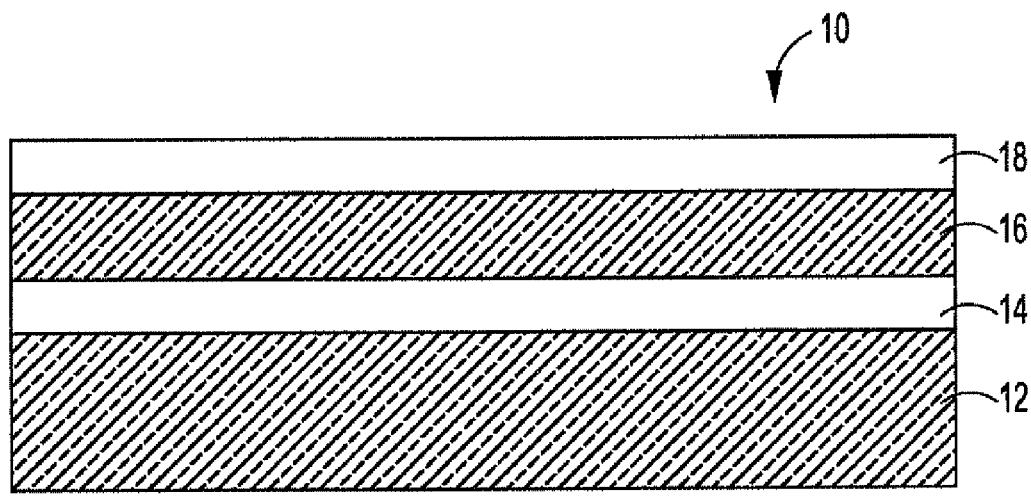
FIGS. 1A-1G are pictorial representations (through cross sectional views) illustrating the basic processing steps used in the present invention for forming the inventive hybrid substrate (See, FIG. 1E or 1F) and a structure including CMOS devices and the hybrid substrate (See, FIG. 1G).
Figure 1B:
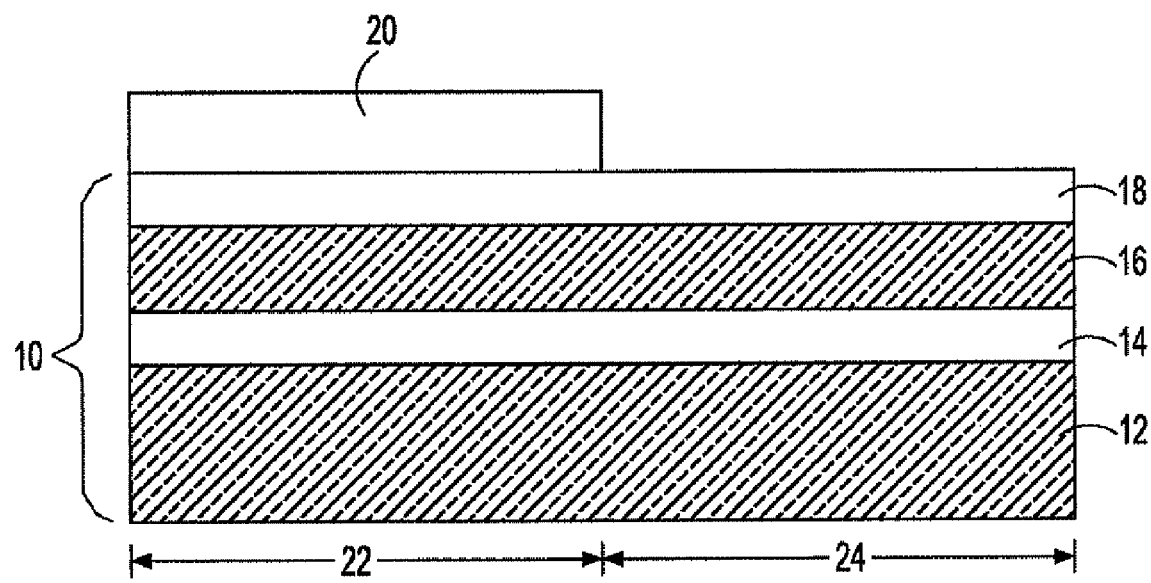

The present invention will now be described in greater detail by referring to the drawings that accompany the present application. The drawings are provided for illustrative purposes and thus the same are not drawn to scale. It is noted that in the drawings and description provided below, the counter-doped region is formed into the second semiconductor region. Although this embodiment is described and illustrated, the present invention also contemplates forming the counter-doped region into the first semiconductor region rather than the second. Also, although the drawings show the presence of one counter-doped region, the present invention contemplates forming more than one counter-doped region.

Reference is first made to FIGS. 1A-1G which illustrate the basic processing steps used in the present invention for providing the inventive semiconductor structures, e.g., hybrid substrate and CMOS devices on said hybrid substrate. The inventive process begins by providing substrate 10 shown in FIG. 1A. As shown, substrate 10 comprises an upper semiconductor material 16, a buried insulating layer 14 and a lower semiconductor layer 12. A surface dielectric 18 can also be located atop the upper semiconductor material 16.

The surface dielectric 18 of the substrate 10 comprises an oxide, nitride, oxynitride or multilayers thereof such as, for example, a nitride/oxide stack that is either present in one of the initial wafers before performing the layer transfer process or it can be formed atop the upper semiconductor material 16 after the layer transfer process. When surface dielectric 18 is formed on the semiconductor material 18 after the layer transfer process, a thermal process (such as, for example, oxidation, nitridation or oxynitridation) or a conventional deposition process (such as, for example, chemical vapor deposition (CVD), plasma-enhanced chemical vapor deposition (PECVD), chemical solution deposition or evaporation) can be used. Notwithstanding the origin of the surface dielectric layer 18, the surface dielectric layer 18 typically has a thickness from about 3 to about 500 nm.

The upper semiconductor material 16 of substrate 10 is comprised of any semiconductor material including, for example, Si, SiC, SiGe, SiGeC, Ge alloys, GaAs, InAs, InP as well as other III/V or II/VI compound semiconductors. The upper semiconductor material 16 may also comprise an SOI layer of a preformed SOI substrate or a layered semiconductor such as, for example, Si/SiGe. The upper semiconductor material 16 is also characterized as having a first crystallographic orientation, which is preferably (110). Although a (110) crystal orientation is preferred, the first semiconductor layer 16 may have a (111), or a (100) crystal orientation. It is noted that the upper semiconductor material 16 forms the first semiconductor material of the inventive hybrid substrate.

The thickness of the upper semiconductor material 16 may vary depending on the initial starting wafers used to form the substrate 10. Typically, however, the upper semiconductor material 16 has a thickness from about 5 to about 500 nm, with a thickness from about 5 to about 100 nm being more highly preferred.

The insulating layer 14 (or buried insulting layer 14) which is located between the upper semiconductor material 16 and the lower semiconductor material 12 has a variable thickness depending upon the initial wafers used to create the substrate 10. Typically, however, the insulating layer 14 has a thickness from about 1 to about 500 nm, with a thickness from about 5 to about 100 nm being even more typical. The insulating layer 14 is an oxide or other like insulator material that is formed on one or both of the wafers prior to performing the layer transfer process.

The lower semiconductor material 12 is comprised of any semiconducting material which may be the same or different from that of the upper semiconductor material 16. Thus, lower semiconductor material 12 may include, for example, Si, SiC, SiGe, SiGeC, Ge alloys, GaAs, InAs, InP as well as other III/V or II/VI compound semiconductors. The lower semiconductor material 12 may also comprise an SOI layer of a preformed SOI substrate or a layered semiconductor such as, for example, Si/SiGe. The lower semiconductor material 12 is also characterized as having a second crystallographic orientation, which is different from the first crystallographic orientation. Note that the crystallographic orientation of the lower semiconductor material 12 will determine the crystallographic orientation of the second semiconductor material to be subsequently regrown on an exposed portion of material 12 by epitaxy. Since the upper semiconductor material 16 is preferably a (110) surface, the crystallographic orientation of the lower semiconductor material 12 is preferably (100). Although a (100) crystal orientation is preferred, the lower semiconductor material 12 may have a (111), or a (110) crystal structure.

The thickness of the lower semiconductor material 12 may vary depending on the initial starting wafers used to form the substrate 10. Typically, however, the lower semiconductor material 12 has a thickness from about 5 nm to about 200 μm, with a thickness from about 5 to about 100 nm being even more typical.

The substrate 10 illustrated in FIG. 1A is formed utilizing a layer transfer process in which bonding of at least two wafers is employed. The two wafers used in fabricating the substrate 10 may include two SOI wafers wherein one of the wafers includes the upper semiconductor material 16 of the substrate 10 and the other wafer includes the lower semiconductor material 12 of the substrate 10; an SOI wafer and a bulk semiconductor wafer; two bulk semiconductor wafers, which both contain an insulating layer 14 thereon; or an SOI wafer and a bulk wafer that includes an ion implant region, such as a $H_2$ implant region, which can be used to split a portion of at least one of the wafers during the layer transfer process.

The layer transfer is achieved by first bringing the two wafers into intimate contact with one another, optionally applying an external force to the contacted wafers, and then heating the two contacted wafers under conditions that are capable of bonding the two wafers together. The heating step may be performed in the presence or absence of an external force. The heating step is typically performed in an inert ambient at a temperature from about 200° to about 1050° C. for a time period about 2 to about 20 hours. More typically, the bonding is performed at a temperature from about 200° to about 400° C. Other bonding temperatures and times, which are also capable of bonding two wafers, are also contemplated herein. The term "inert ambient" is used in the present invention to denote an atmosphere in which an inert gas, such as He, Ar, $N_2$, Xe, Kr or a mixture thereof, is employed. A preferred ambient used during the bonding process is $N_2$.

In the embodiment where two SOI wafers are employed, some material layers of at least one of the SOI wafers may be removed after bonding utilizing a planarization process such as chemical mechanical polishing (CMP) or grinding and etching. The planarization process stops when surface dielectric layer 18 is reached. Thus, surface dielectric layer 18 can serve as an etch stop layer in the present invention.

In the embodiment in which one of the wafers includes an ion implant region, the ion implant region forms a porous region during bonding which causes a portion of the wafer above the ion implant region to break off leaving a substrate 10 such as is shown, for example, in FIG. 1A. The implant region is typically comprised of $H_2$ ions that are implanted into the surface of the wafer utilizing ion implantation conditions that are well known to those skilled in the art. In this embodiment, lower bonding temperatures than those described above are typically used.

Mask 20 is then formed on a predetermined portion of the substrate 10 of FIG. 1A so as to protect a portion of the substrate 10, while leaving another portion of the substrate 10 unprotected. The protected portion of the substrate 10 defines a first semiconductor region 22, whereas the unprotected portion of the substrate 10 defines a second semiconductor region 24.

In one embodiment, mask 20 is formed on a predetermined portion of the surface dielectric layer 18 by applying a photoresist mask to the entire surface of the substrate 10. After application of the photoresist mask, the mask is patterned by lithography, which includes the steps of exposing the photoresist to a pattern of radiation and developing the pattern utilizing a resist developer. In another embodiment mask 20 is a nitride or oxynitride layer that is formed and patterned utilizing lithography and etching. The nitride or oxynitride mask 20 may be removed after defining the second semiconductor region 24. The resultant structure including the mask 20 formed on a predetermined portion of the substrate 10 is shown, for example, in FIG. 1B; the various semiconductor regions are labeled as 22 and 24.

After providing the mask 20 to the substrate 10 defining the various semiconductor regions, the structure is subjected to a first etching step including a first mask level (not shown) that defines the active area RX within the second semiconductor region 24. This etching step removes the unprotected portion of the surface dielectric layer 18 as well as underlying portion of the upper semiconductor layer 16, stopping atop the insulating layer 14. The etching step may be performed utilizing a single etching process or multiple etching steps may be employed. The etching used at this point of the present invention may include a dry etching process such as reactive-ion etching, ion beam etching, plasma etching or laser etching, a wet etching process wherein a chemical etchant is employed or any combination thereof. In a preferred embodiment of the present invention, reactive-ion etching (RIE) is used in selectively removing the unprotected portions of the surface dielectric layer 18 and the upper semiconductor material 16, stopping on a surface of the insulating layer 14 in the second semiconductor region 24.

After defining the active area RX within the second semiconductor region 24, a second masking level (not shown) is used to define at least one epitaxial window 26 in the exposed portion of the insulating layer 14 and then a second etching process is used to remove the exposed buried insulating layer 14 providing a discontinuous buried insulating layer 15 within the second semiconductor region 24; the discontinuity is provided by the window 26. Note that the mask level used to define the window 26 in the second semiconductor region 24 is smaller than the active area RX. The second etching process includes any etching technique that selectively removes the exposed portion of the buried insulating layer 14, stopping on a surface of the lower semiconductor material 12. The resultant structure after the first and second etching processes have been performed is shown, for example, in FIG. 1C. Note that the sidewalls of the protected first semiconductor region 22, i.e., the surface dielectric layer 18 and the upper semiconductor material 16, are exposed after this etching step. As shown, the exposed sidewalls of layers 18 and 16 are aligned with an outer most edge of mask 20. Also note that a continuous buried insulating layer 14 is present in the first semiconductor region 22 since no etching of that layer occurs in the present invention.

Figure 1C:
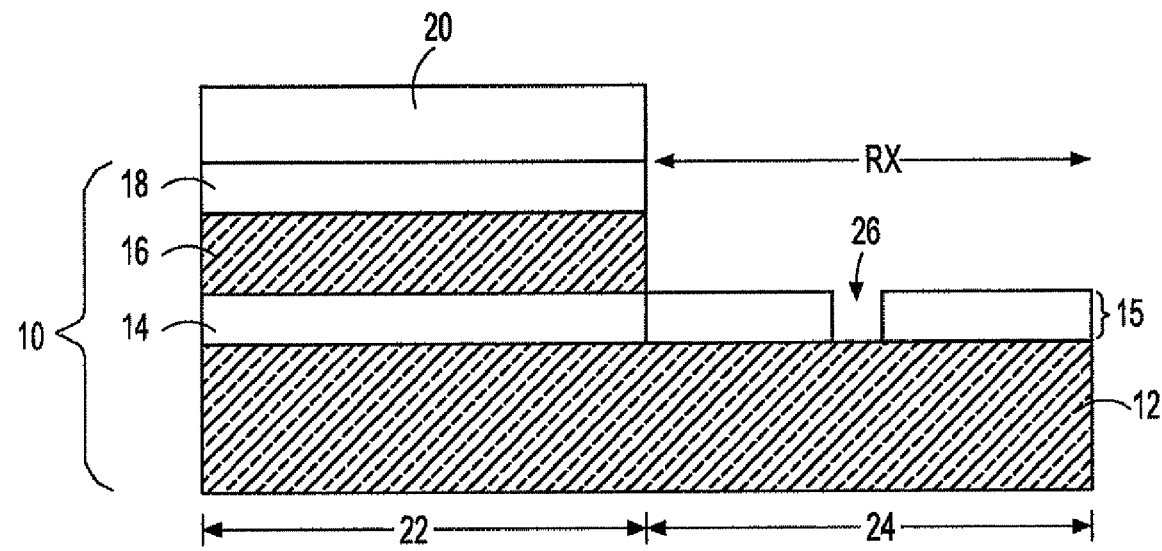

The mask 20 is then removed from the structure shown in FIG. 1C utilizing a conventional resist stripping process and then a liner or spacer 21 is typically, but not always, formed on the exposed sidewalls. The optional liner or spacer 21 is formed by deposition and etching. When present, the liner or spacer 21 is comprised of an insulating material such as, for example, an oxide.

Next, at least one counter-doped region 28 and a semiconductor material 30 are formed such that the counter-doped region 28 is located within each window 26 and the semiconductor material 30 is formed on the counter-doped region 28 filling the RX of the second semiconductor region 24. In accordance with the present invention, regions 28 and 30 are comprised of the same material except that doping (by implantation or in-situ epi growth) occurs within the window 26 so that the counter-doped region 28 forms in the window. As such, the counter-doped region 28 provides at least one break in the buried insulating layer within the second semiconductor region 24, yet that region remains SOI-like. Moreover, the counter-doped region 28 isolates, electrically, the semiconductor material 30 from the lower semiconductor material 12 in the second semiconductor region 24.

In the present invention, the counter-doped region 28 includes an upper doped region of a first conductivity type (P or N, preferably P), a middle doped region of a second conductivity type that is different from the first conductivity type (N or P, preferably N), and a lower doped region of said first conductivity type (P or N, preferably P).

In some embodiments of the present invention, the at least one counter-doped region 28 has a doping profile that is engineered for better SCE control without additional capacitance, leakage and mobility degradation. For example, the counter-doped region 28 may comprise an upper P-doped region, a middle N-doped region and a lower P-doped region in which the upper P-doped region has a higher dopant concentration near the semiconductor material that will include the device channel relative to the lower doped region of the same conductivity type.

The counter-doping region 28 is formed by epitaxy followed by ion implantation or by utilizing an in-situ epitaxial growth process. The doping content with the counter-doped region 28 can be selected by one skilled in the art. Typically, and by way of an example, the upper doped region is a P doped region having a dopant concentration from about $5 \times 10^{17}$ to about $5 \times 10^{19}$ atoms/cm$^3$, the middle doped region is a N doped region having a doping concentration from about $5 \times 10^{16}$ to about $5 \times 10^{18}$ atoms/cm$^3$, and the lower doped region is a P doped region that has a doping concentration from about $1 \times 10^{16}$ to about $5 \times 10^{18}$ atoms/cm$^3$.

In accordance with the present invention, the semiconductor material 30 as well as the counter-doped region 28 have a crystallographic orientation that is the same as the crystallographic orientation of the lower semiconductor material 12. The resultant structure is shown, for example, in FIG. 1D.

The semiconductor material 30 (as well as the counter-doped region 28) may comprise any Si-containing semiconductor, such as Si, strained Si, SiGe, SiC, SiGeC or combinations thereof, which is capable of being formed utilizing a selective epitaxial growth method. In some preferred embodiments, the semiconductor material 30 is comprised of Si. In other preferred embodiments, the semiconductor material 30 is a strained Si layer that is located atop a relaxed SiGe alloy layer. In the present invention, the semiconductor material 30 may be referred to as a regrown semiconductor material or just as the second semiconductor material of the inventive hybrid substrate.

Figure 1D:
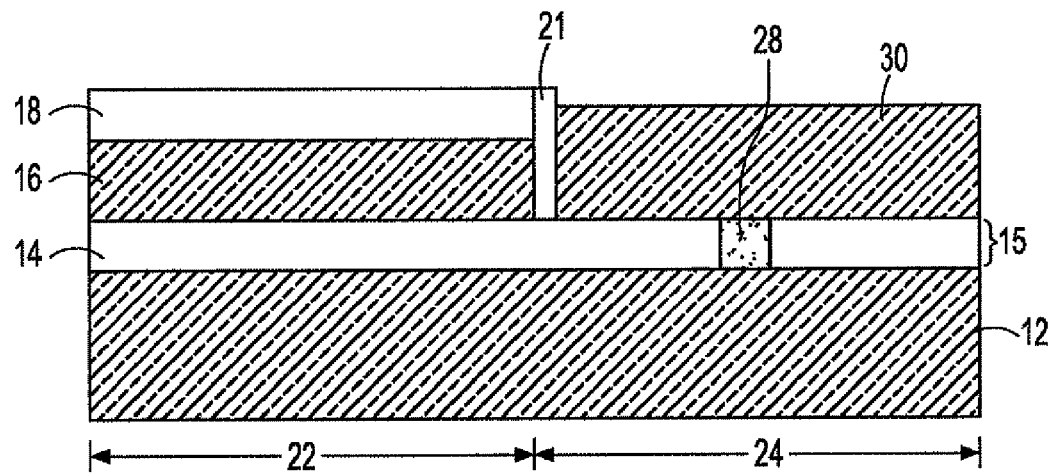
Figure 1E:
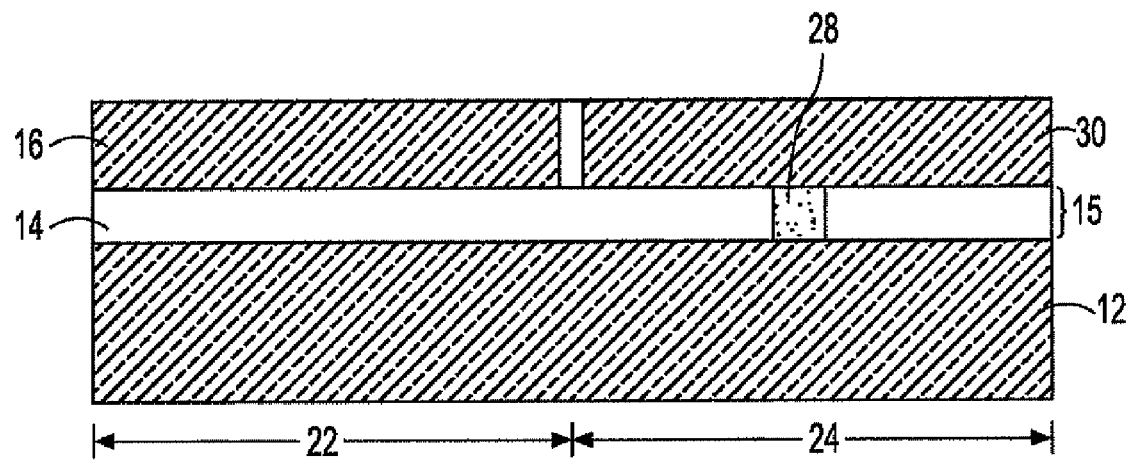

Next, the structure shown in FIG. 1D is subjected to a planarization process such as chemical mechanical polishing (CMP) or grinding such that the upper surface of the semiconductor material (i.e., the second semiconductor material) 30 is substantially planar with the upper surface of the upper semiconductor material (i.e., the first semiconductor material) 16. Note that the previously protected portion of surface dielectric layer 18 is removed during this planarization process. The planarized structure is shown in FIG. 1E. An optional oxidation step can be added to improve the surface property of the semiconductor material 30.

After providing the substantially planar surfaces, an isolation region 32, such as a shallow trench isolation region, is typically formed so as to isolate the first semiconductor region 22 from the second semiconductor region 24. The isolation region 32 is formed utilizing processing steps that are well known to those skilled in the art including, for example, trench definition and etching, optionally lining the trench with a diffusion barrier, and filling the trench with a trench dielectric such as an oxide. After the trench fill, the structure may be planarized and an optional densification process step may be performed to densify the trench dielectric. The resultant hybrid substrate containing isolation region 32 is show, for example, in FIG. 1F. Note that the liner or spacer 21 is replaced by the isolation region 32.

Figure 1F:
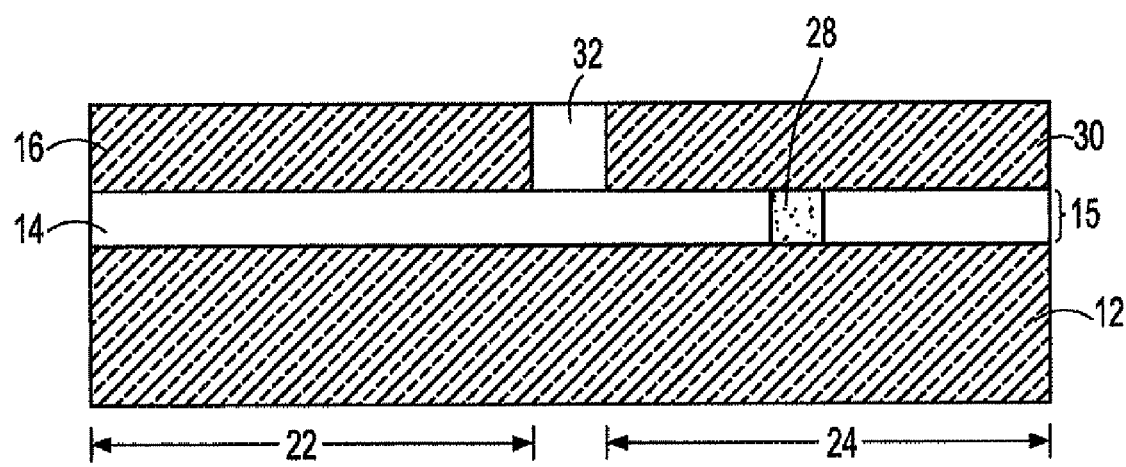
Figure 1G:
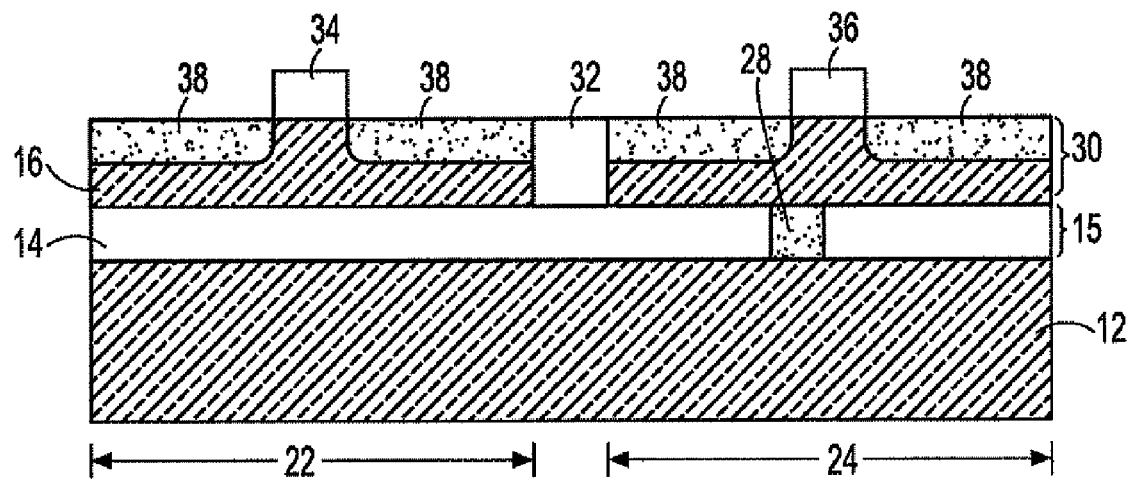

FIG. 1G shows the integrated structure that is formed after a first semiconductor device 34 is formed on a portion of the upper semiconductor layer 16 and a second semiconductor device 36 is formed on the regrown semiconductor material 30. Despite showing the presence of only one semiconductor device in each device region, the present invention contemplates forming a plurality of each type of device in the specific device region. In accordance with the present invention, the first semiconductor device may be a pFET or an nFET, whereas the second semiconductor device may be an nFET or pFET, with the proviso that the first semiconductor device is different from the second semiconductor device and that the specific device is fabricating on a crystal orientation that provides a high performance device. The pFETs and nFETs are formed utilizing standard CMOS processing steps that are well known to those skilled in the art. Each FET includes a gate dielectric, a gate conductor, an optional hard mask located atop the gate conductor, spacers located on sidewalls of at least the gate conductor, and source/drain diffusion regions. The diffusion regions are labeled as 38 in FIG. 1G. Note that the pFET is formed over the semiconductor material that has a (110), or (111) orientation, whereas the nFET is formed over a semiconductor surface having a (100), or (111) orientation.

Figure 2:
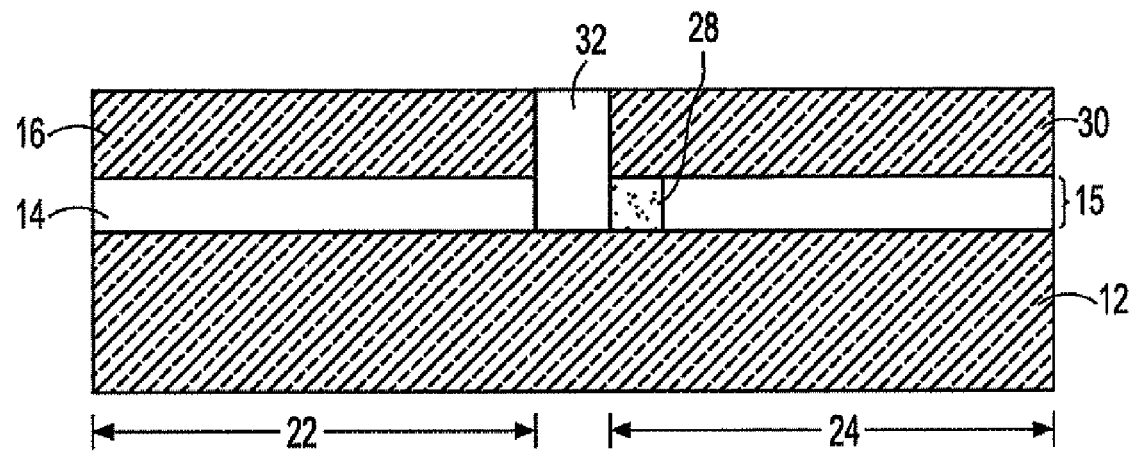
FIG. 2 is a pictorial representation (through a cross sectional view) illustrating another possible hybrid substrate that can be formed utilizing the processing steps of the present invention.

FIG. 2 is an illustration of another hybrid substrate that can be formed utilizing the processing described above. In the embodiment illustrated, a counter-doped region 28 is formed into the second semiconductor region 24 such that it will be located at the source area of the resultant nFET or at the drain area of the resulting pFET.

Figure 3:
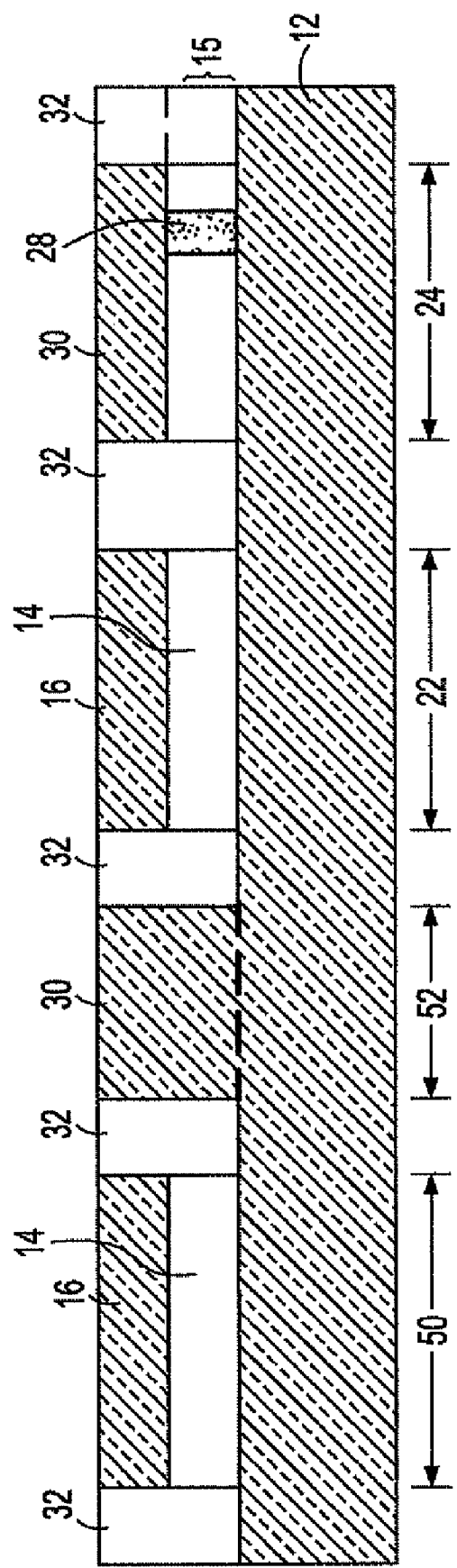
FIG. 3 is a pictorial representation (through a cross sectional view) illustrating another possible hybrid substrate that can be formed utilizing the basic processing steps of the present invention.

FIG. 3 shows an illustration of another hybrid substrate that can be formed utilizing the process described above. In the illustrated drawing, SOI, bulk and pseudo-SOI can be integrated together and memory and/or analog devices are formed in the bulk device region. Note that the right hand portion of the illustrated structure is the same as shown in FIG. 1F. In FIG. 3, like materials are referred to using like reference numerals as described above. The left hand portion adjacent to the first semiconductor region 22 includes a third semiconductor region 50 comprising a third semiconductor material 16 of a third crystallographic orientation and a fourth semiconductor region 52 comprising a fourth semiconductor material 30 having a fourth crystallographic orientation, wherein the third crystallographic orientation is different from the fourth crystallographic orientation, but equal to the first crystallographic orientation and said fourth crystallographic orientation is equal to the second crystallographic orientation. Note that in the drawing, reference numerals 16 and 30 are used in defining the third and fourth semiconductor materials, respectively. In this embodiment, the semiconductor material each have upper surfaces that are coplanar to one another and one of the third or fourth regions includes a continuous buried insulating layer and said other of said third or fourth regions is present on a semiconductor substrate having said second crystal orientation.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of fabricating a semiconductor structure comprising:

providing a substrate comprising an upper semiconductor material of a first crystallographic orientation and a lower semiconductor material of a second crystallographic orientation separated by a buried insulating layer, said first crystallographic orientation is different from said second crystallographic orientation;

protecting a portion of said substrate to define a first semiconductor region, while leaving another portion of the substrate unprotected and defining a second semiconductor region;

first etching said unprotected portion of the substrate to expose a surface of said buried insulating layer utilizing a first mask that defines an active area within the second semiconductor region;

second etching said exposed surface of said buried insulating layer to expose said lower semiconductor material utilizing a second mask that has at least one opening that provides a window that is smaller in size than the active area; and growing a semiconductor material within said second semiconductor region on said exposed lower semiconductor material, said regrown semiconductor material having said second crystallographic orientation, wherein during initial stages of said growing process a counter-doped region is formed within said at least one opening.

2. The method of claim 1 wherein said providing said substrate comprises a layer transfer process.

3. The method of claim 1 wherein said first etching step selectively removes at least said first semiconductor material from said second semiconductor region, stopping atop said buried insulating layer.

4. The method of claim 1 wherein said growing comprises an epitaxial growth process.

5. The method of claim 1 wherein said counter-doped region is formed by an in-situ epitaxial growth process or epitaxial growth and ion implantation.

6. The method of claim 1 wherein said at least one counter-doped region comprises an upper doped region of a first conductivity type, a middle doped region of a second conductivity type that differs from the first conductivity type, and a lower doped region of said first conductivity type.

7. The method of claim 6 wherein said upper doped region has a higher concentration of a first conductivity type dopant as compared to the lower doped region.

8. The method of claim 6 wherein said upper doped region is P-type, said middle doped region is N-type and said lower doped region is P-type.

9. The method of claim 1 wherein said at least one counter-doped region is formed at the source area of an overlying nFET or at the drain area of an overlying pFET.

10. The method of claim 1 further comprising forming an isolation region separating said first semiconductor region from said second semiconductor region.

11. The method of claim 1 further comprising forming at least one field effect transistor in each of said semiconductor regions.

12. The method of claim 11 wherein said at least one field effect transistor in said first semiconductor region is a pFET that is located on a (110) crystal surface and said at least field effect transistor in said second semiconductor region is an nFET located on a (100) crystal surface.

13. The method of claim 11 wherein said at least one field effect transistor in said first semiconductor region is an nFET that is located on a (100) crystal surface and said at least field effect transistor in said second semiconductor region is a pFET located on a (110) crystal surface.

* * * * *